US012608513B2

(12) United States Patent
Karri et al.

(10) Patent No.: US 12,608,513 B2
(45) Date of Patent: Apr. 21, 2026

(54) SIMULATING COLLABORATIVE EQUILIBRIUM IN MULTI-MACHINE ENVIRONMENT

(71) Applicant: INTERNATIONAL BUSINESS MACHINES CORPORATION, Armonk, NY (US)

(72) Inventors: Venkata Vara Prasad Karri, Visakhapatnam (IN); Sarbajit K. Rakshit, Kolkata (IN); Shailendra Moyal, Pune (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 918 days.

(21) Appl. No.: 17/651,249

(22) Filed: Feb. 16, 2022

(65) Prior Publication Data

US 2023/0259669 A1 Aug. 17, 2023

(51) Int. Cl.
*G06F 30/17* (2020.01)

(52) U.S. Cl.
CPC .................................... *G06F 30/17* (2020.01)

(58) Field of Classification Search
CPC ........... G06F 30/00; G06F 30/17; G06F 30/20
USPC ........................................................ 703/7, 6
See application file for complete search history.

(56) References Cited

U.S. PATENT DOCUMENTS

| | | | |
|---|---|---|---|
| 10,710,849 B2 | 7/2020 | Elvery | |
| 2018/0202892 A1 | 7/2018 | Vaskinn | |
| 2019/0270622 A1* | 9/2019 | Elvery ................. | B60G 17/005 |

OTHER PUBLICATIONS

Shen, HaiRong et al., "The Realization of Optimization on Balance System of Large Floating Crane with Full Rotation Based on Genetic Algorithmic", 2011, IEEE. (Year: 2011).*
Lai, Xiaonan et al., "Designing a Shape-Performance Integrated Digital Twin Based on Multiple Models and Dynamic Data: A Boom Crane Example", Jul. 2021, Journal of Mechanical Design, vol. 143, ASME. (Year: 2021).*
Chen, Ying-Shu et al., "Dynamical Balancing of Machinery Considering the Effect of Loading Based on Virtual Prototyping Technology", 2010, IEEE. (Year: 2010).*

(Continued)

*Primary Examiner* — Cedric Johnson
(74) *Attorney, Agent, or Firm* — Robert R. Aragona

(57) ABSTRACT
An embodiment for simulating collaborative equilibrium in a multi-machine environment is provided. The embodiment may include receiving data relating to an activity and one or more machines to perform the activity. The embodiment may also include identifying specifications of one or more objects associated with the activity and specifications of the one or more machines handling the one or more objects. The embodiment may further include executing a digital twin simulation of the activity. The embodiment may also include in response to determining an unstable condition associated with at least one machine of the one or more machines is detected, identifying a time point of the unstable condition. The embodiment may further include predicting a counterweight to be applied to the at least one machine associated with the unstable condition. The embodiment may also include applying the counterweight in the digital twin simulation to the at least one machine.

20 Claims, 6 Drawing Sheets

(56) References Cited

OTHER PUBLICATIONS

Disclosed Anonymously, "Active or Intelligent Counterweight", IPCOM000266578D, Jul. 29, 2021, 8 Pages, https://ip.com/IPCOM/000266578.

Lai et al., "Designing a Shape-Performance Integrated Digital Twin Based on Multiple Models and Dynamic Data: A Boom Crane Example", Journal of Mechanical Design, Jan. 2021, 15 Pages, https://www.researchgate.net/publication/348664211.

Mell et al., "The NIST Definition of Cloud Computing", Recommendations of the National Institute of Standards and Technology, NIST Special Publication 800-145, Sep. 2011, 7 pages.

* cited by examiner

100

CLIENT COMPUTING DEVICE
102

PROCESSOR
104

DATA STORAGE
DEVICE 106

SOFTWARE
PROGRAM
108

COLLABORATIVE
EQUILIBRIUM
PROGRAM
110A

NETWORK    114

IOT DEVICE
118

SERVER 112

COLLABORATIVE
EQUILIBRIUM
PROGRAM
110B

DATABASE
116

SIMULATING COLLABORATIVE EQUILIBRIUM IN MULTI-MACHINE ENVIRONMENT

BACKGROUND

The present invention relates generally to the field of computing, and more particularly to a system for simulating collaborative equilibrium in a multi-machine environment.

Machines, such as robots, are currently used to perform a wide variety of activities. Some of these activities were previously exclusively performed by humans (e.g., repetitive tasks on a manufacturing assembly line), whereas others have traditionally been performed by heavy machinery (e.g., removal of debris by construction cranes). Machines enable organizations, including manufacturers and construction companies, to carry out different tasks more seamlessly than their historical counterparts, getting work done faster and with minimum wasted effort. As automation becomes commonplace, the demand for machines and robotic technology is expected to increase in the coming decades.

SUMMARY

According to one embodiment, a method, computer system, and computer program product for simulating collaborative equilibrium in a multi-machine environment is provided. The embodiment may include receiving data relating to an activity and one or more machines to perform the activity. The embodiment may also include identifying specifications of one or more objects associated with the activity and specifications of the one or more machines handling the one or more objects. The embodiment may further include executing a digital twin simulation of the activity based on the specifications of the one or more objects, the specifications of the one or more machines, and a contextual surrounding of the activity. The embodiment may also include in response to determining an unstable condition associated with at least one machine of the one or more machines is detected at any time point during the digital twin simulation, identifying the time point of the unstable condition. The embodiment may further include predicting a counterweight to be applied to the at least one machine associated with the unstable condition based on the time point. The embodiment may also include applying the counterweight in the digital twin simulation to the at least one machine associated with the unstable condition based on the prediction.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
FIG. 1 illustrates an exemplary networked computer environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

Embodiments of the present invention relate to the field of computing, and more particularly to a system for simulating collaborative equilibrium in a multi-machine environment. The following described exemplary embodiments provide a system, method, and program product to, among other things, determine whether an unstable condition associated with a machine (e.g., toppling) is detected during a digital twin simulation and, accordingly, predict a counterweight to be applied to the machine associated with the unstable condition. Therefore, the present embodiment has the capacity to improve industrial machine technology by maintaining equilibrium and stability in any multi-machine environment.

As previously described, machines, such as robots, are currently used to perform a wide variety of activities. Some of these activities were previously exclusively performed by humans (e.g., repetitive tasks on a manufacturing assembly line), whereas others have traditionally been performed by heavy machinery (e.g., removal of debris by construction cranes). Machines enable organizations, including manufacturers and construction companies, to carry out different tasks more seamlessly than their historical counterparts, getting work done faster and with minimum wasted effort. As automation becomes commonplace, the demand for machines and robotic technology is expected to increase in the coming decades. When a machine is carrying a load (e.g., a shipping container), the center of gravity may change, causing the machine to topple. This problem is typically addressed by applying a static object to the machine, such as an object made of iron, steel, concrete, and/or other alloys. However, depending on the type of activity and surrounding environment, the static object may be insufficient to prevent the unstable condition from occurring. It may therefore be imperative to have a system in place to validate the equilibrium of any machine in a multi-machine environment. Thus, embodiments of the present invention may provide advantages including, but not limited to, maintaining equilibrium and stability in any multi-machine environment, proactively preventing damage to any machine in the multi-machine environment, and utilizing already-available resources to provide a counterweight. The present invention does not require that all advantages need to be incorporated into every embodiment of the invention.

According to at least one embodiment, in a multi-machine environment, data relating to an activity and one or more machines to perform the activity may be received in order to identify specifications of one or more objects associated with the activity and specifications of the one or more machines handling the objects. Upon identifying the specifications of the one or more objects and the specifications of the one or more machines, a digital twin simulation of the activity may be executed based on the specifications of the one or more machines, the specifications of the one or more objects, and a contextual surrounding of the activity. In response to determining an unstable condition associated with at least one machine of the one or more machines is detected at any time point during the digital twin simulation, the time point of the unstable condition may be identified so that a counterweight to be applied to the at least one machine associated with the unstable condition may be predicted based on the time point. According to at least one embodiment, the unstable condition may be a toppling of the at least one machine. According to at least one other embodiment, the unstable condition may be a deformity in the at least one machine. The counterweight may then be applied in the digital twin simulation to the at least one machine associated with the unstable condition based on the prediction.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flow-chart and/or block diagram block or blocks.

The flowchart and block diagrams in the Figures illustrate the architecture, functionality, and operation of possible implementations of systems, methods, and computer pro-gram products according to various embodiments of the present invention. In this regard, each block in the flowchart or block diagrams may represent a module, segment, or portion of instructions, which comprises one or more executable instructions for implementing the specified logi-cal function(s). In some alternative implementations, the functions noted in the blocks may occur out of the order noted in the Figures. For example, two blocks shown in succession may, in fact, be executed concurrently or sub-stantially concurrently, or the blocks may sometimes be executed in the reverse order, depending upon the function-ality involved. It will also be noted that each block of the block diagrams and/or flowchart illustration, and combina-tions of blocks in the block diagrams and/or flowchart illustration, can be implemented by special purpose hard-ware-based systems that perform the specified functions or acts or carry out combinations of special purpose hardware and computer instructions.

The following described exemplary embodiments provide a system, method, and program product to determine whether an unstable condition associated with a machine (e.g., toppling) is detected during a digital twin simulation and, accordingly, predict a counterweight to be applied to the machine associated with the unstable condition.

Referring to FIG. 1, an exemplary networked computer environment 100 is depicted, according to at least one embodiment. The networked computer environment 100 may include client computing device 102, a server 112, and Internet of Things (IoT) Device 118 interconnected via a communication network 114. According to at least one implementation, the networked computer environment 100 may include a plurality of client computing devices 102 and servers 112, of which only one of each is shown for illustrative brevity.

The communication network 114 may include various types of communication networks, such as a wide area network (WAN), local area network (LAN), a telecommu-nication network, a wireless network, a public switched network and/or a satellite network. The communication network 114 may include connections, such as wire, wireless communication links, or fiber optic cables. It may be appre-ciated that FIG. 1 provides only an illustration of one implementation and does not imply any limitations with regard to the environments in which different embodiments may be implemented. Many modifications to the depicted environments may be made based on design and implemen-tation requirements.

Client computing device 102 may include a processor 104 and a data storage device 106 that is enabled to host and run a software program 108 and a collaborative equilibrium program 110A and communicate with the server 112 and IoT Device 118 via the communication network 114, in accor-dance with one embodiment of the invention. Client com-puting device 102 may be, for example, a mobile device, a telephone, a personal digital assistant, a netbook, a laptop computer, a tablet computer, a desktop computer, or any type of computing device capable of running a program and accessing a network. As will be discussed with reference to FIG. 4, the client computing device 102 may include internal components 402a and external components 404a, respec-tively.

The server computer 112 may be a laptop computer, netbook computer, personal computer (PC), a desktop com-puter, or any programmable electronic device or any net-work of programmable electronic devices capable of hosting and running a collaborative equilibrium program 110B and a database 116 and communicating with the client comput-ing device 102 and IoT Device 118 via the communication network 114, in accordance with embodiments of the inven-tion. As will be discussed with reference to FIG. 4, the server computer 112 may include internal components 402b and external components 404b, respectively. The server 112 may also operate in a cloud computing service model, such as Software as a Service (SaaS), Platform as a Service (PaaS), or Infrastructure as a Service (IaaS). The server 112 may also be located in a cloud computing deployment model, such as a private cloud, community cloud, public cloud, or hybrid cloud.

IoT Device 118 may be a machine, a robotic device, and/or any other automated or manual device known in the art for performing labor related tasks that is capable of connecting to the communication network 114, and trans-mitting and receiving data with the client computing device 102 and the server 112.

According to the present embodiment, the collaborative equilibrium program 110A, 110B may be a program capable of receiving data relating to an activity and one or more machines to perform the activity, determining whether an unstable condition associated with a machine (e.g., toppling) is detected during a digital twin simulation, predicting a counterweight to be applied to the machine associated with the unstable condition, maintaining equilibrium and stability in any multi-machine environment, proactively preventing damage to any machine in the multi-machine environment, and utilizing already-available resources to provide a coun-terweight. The collaborative equilibrium simulation method is explained in further detail below with respect to FIG. 2.

Figure 2:
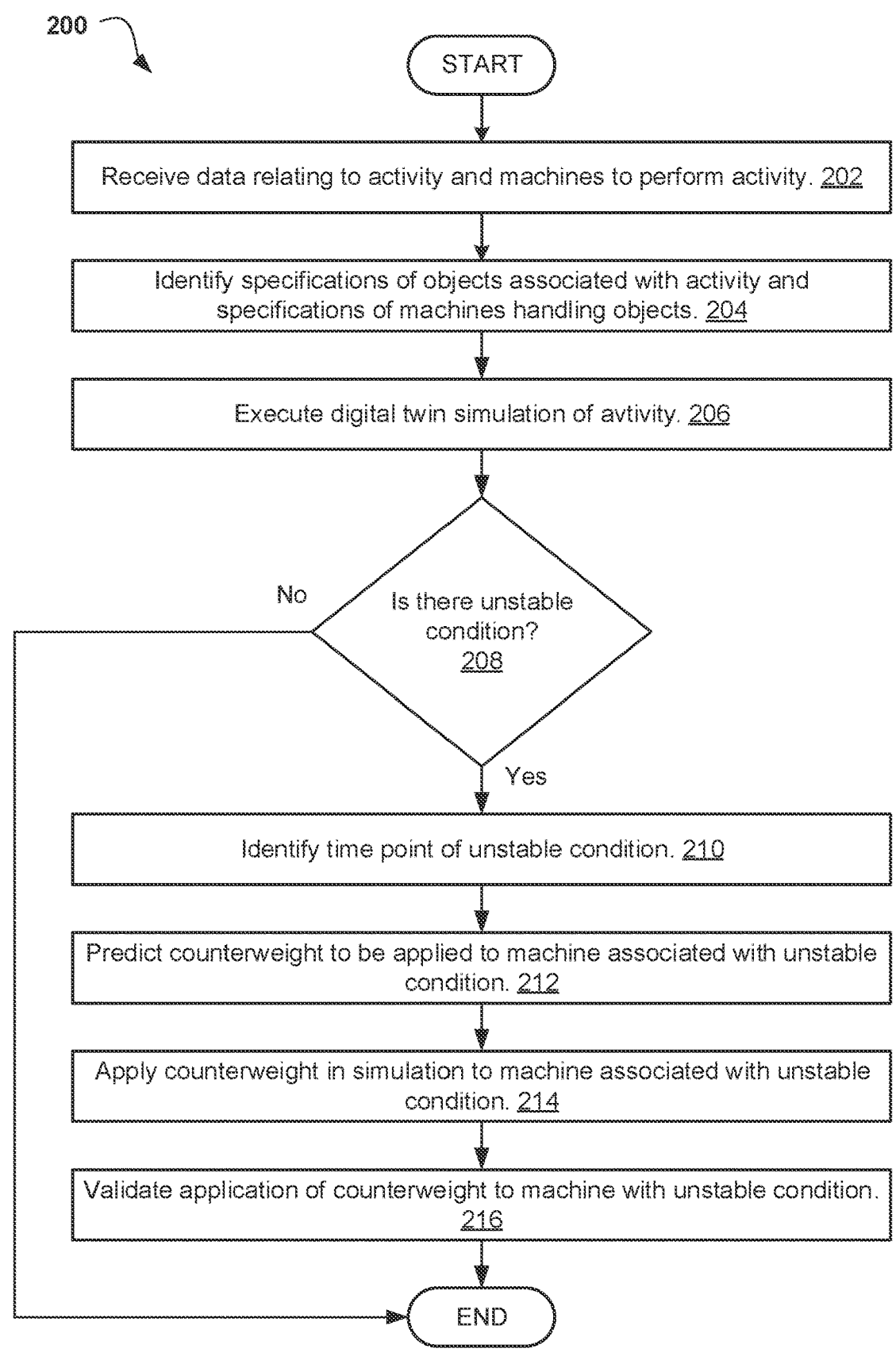
FIG. 2 illustrates an operational flowchart for simulating collaborative equilibrium in a multi-machine environment in a collaborative equilibrium simulation process according to at least one embodiment.

Referring now to FIG. 2, an operational flowchart for simulating collaborative equilibrium in a multi-machine environment in a collaborative equilibrium simulation pro-cess 200 is depicted according to at least one embodiment. At 202, the collaborative equilibrium program 110A, 110B receives the data relating to the activity and the one or more machines to perform the activity.

The data relating to the activity may include the type of activity to be performed in the multi-machine environment. Examples of an activity may include, but are not limited to, assembling objects in a manufacturing facility, removing objects in a disaster recovery area, and transporting objects from one location to another, (e.g., moving a shipping container from a ship to a dock). The data relating to the activity may also include the one or more objects associated with the activity. Examples of an object may include, but are not limited to, a shipping container, an automobile, a device on an assembly line, construction materials, and/or any object capable of being moved from a source to a destina-tion, i.e., from one location to another location. The data relating to the activity may further include the contextual surrounding of the activity. The contextual surrounding may include information including, but not limited to, weather, type of ground surface, and/or slope of the ground surface where the activity is to be performed. For example, the activity may be performed in a windy environment on a dirt surface on a hill. Contrarily, the activity may be performed in a sunny environment on a paved surface which is flat.

The data relating to the one or more machines to perform the activity may include the types of machines to perform the activity. Examples of a machine include, but are not limited to, a crane, a robot (i.e., an automated device), an excavator, and/or any other machine known in the art capable of moving objects from a source to a destination, i.e., from one location to another location.

According to at least one embodiment, a user may manually input the data into a user interface (UI), which may be received by the collaborative equilibrium program 110A, 110B. The user may be an individual who has background knowledge of the activity, such as a foreman or manager of an activity. For example, the user may specify that the activity to be performed is moving cargo on a ship from one location to another location. Based on the type of activity, the collaborative equilibrium program 110A, 110B may derive the one or more objects associated with the activity and the one or more machines to perform the activity. Continuing the example above, when the user specifies the activity to be performed is moving cargo, the collaborative equilibrium program 110A, 110B may infer the object is a shipping container and the machine to move the object is a crane. According to at least one other embodiment, the user may also specify the one or more objects and the one or more machines. This data may be used in the digital twin simulation, described in further detail below with respect to step 206.

Then, at 204, the collaborative equilibrium program 110A, 110B identifies the specifications of the one or more objects associated with the activity and the specifications of the one or more machines handling the objects.

The specifications of the one or more objects may include the dimensions, weight, and/or type of materials (e.g., iron, steel, rubber, concrete, or plastic) of the one or more objects. According to at least one embodiment, the collaborative equilibrium program 110A, 110B may identify the specifications based on the types of objects associated with the activity. For example, when the data received with respect to step 202 above indicates that the object is one or more shipping containers, the collaborative equilibrium program 110A, 110B may access a database, such as database 116, to obtain the typical weight, dimensions, and materials of a shipping container. According to at least one other embodiment, the user may specify the dimensions, weight, and/or type of materials via the UI when the one or more objects are unique. For example, the shipping container to be moved may be heavier or lighter than a standard shipping container.

Similarly, the specifications of the one or more machines handling the objects may include the dimensions, weight, and/or type of materials of the one or more machines. According to at least one embodiment, the collaborative equilibrium program 110A, 110B may identify the specifications based on the types of machines used to perform the activity. For example, when the data received with respect to step 202 above indicates that the machine is one or more cranes, the collaborative equilibrium program 110A, 110B may access a database, such as database 116, to obtain the typical weight, dimensions, and materials of a crane. According to at least one other embodiment, the user may specify the dimensions, weight, and/or type of materials via the UI when the one or more machines are unique. For example, the crane to be used may be heavier or lighter than a standard crane. The specifications of the one or more objects and the specifications of the one or more machines may also be used in the digital twin simulation, described in further detail below with respect to step 206.

Next, at 206, the collaborative equilibrium program 110A, 110B executes the digital twin simulation of the activity. The digital twin simulation is executed based on the specifications of the one or more objects, the specifications of the one or more machines, and the contextual surrounding of the activity. Depending on the type of activity to perform, the collaborative equilibrium program 110A, 110B may obtain a digital twin of the one or more objects and the one or more machines from a digital twin library. For example, when the activity is building a structure on a construction site, a digital twin may be obtained for an excavator and/or a crane, and a digital twin may be obtained for concrete, steel and/or iron beams, rebar, as well as other construction materials. The digital twin of the one or more objects and the digital twin of the one or more machines used in the simulation may have the same specifications these objects and machines have in the real-world. This is to ensure maximum accuracy during the digital twin simulation.

Similarly, the digital twin simulation may be executed in accordance with the contextual surrounding described above with respect to step 202, such as weather, type of ground surface, and/or slope of the ground surface where the activity is to be performed. According to at least one embodiment, the user may specify the contextual surrounding. For example, the user may specify the activity is to be performed in a windy environment on a dirt surface, where the dirt surface has a slope. In another example, the user may specify the activity is to be performed in a sunny environment on a paved surface which is flat. According to at least one other embodiment, the collaborative equilibrium program 110A, 110B may infer the weather associated with the contextual surrounding based on the time of year and geographic location. For example, if the activity is to take place in December in Chicago, the collaborative equilibrium program 110A, 110B may infer the contextual surrounding will be windy and performed on a flat, paved surface. In another example, if the activity is to take place in June in New York, the collaborative equilibrium program 110A, 110B may infer the contextual surrounding will be sunny and performed on a flat, paved surface.

Then, at 208, the collaborative equilibrium program 110A, 110B determines whether the unstable condition associated with the at least one machine of the one or more machines is detected at any time point during the digital twin simulation. As described above with respect to step 206, the collaborative equilibrium program 110A, 110B executes the digital twin simulation of the activity. During the simulation, the one or more machines may perform the range of motions the one or more machines perform in the real-world. It may be appreciated that during the first execution of the digital twin simulation, the one or more machines may be handling the one or more objects without a counterweight. In this manner, the unstable condition may be detected. In a multi-machine environment, one or more of these machines may be associated with the unstable condition. Examples of an unstable condition include, but are not limited to, a toppling of the at least one machine, a deformity in the at least one machine (e.g., bending or twisting of parts of the machine), and/or any other condition that may cause damage to the at least one machine. For example, a machine may topple when moving a shipping container from the ship to the dock. This machine may be associated with the unstable condition.

In response to determining the unstable condition is detected (step 208, "Yes" branch), the collaborative equilibrium simulation process 200 proceeds to step 210 to identify the time point of the unstable condition. In response to determining the unstable condition is not detected (step 208, "No" branch), the collaborative equilibrium simulation process 200 ends.

Next, at 210, the collaborative equilibrium program 110A, 110B identifies the time point of the unstable condition.

During the digital twin simulation, the collaborative equilibrium program 110A, 110B may use a timer to time the activity from start to finish. For example, where the activity is building a structure at a construction site, the digital twin simulation of the activity may include a crane moving beams or rebar from one location to another location, and the timer may measure the amount of time to complete the activity from the beginning of the activity until the end of the activity. In the example above, the beginning of the activity may be when the crane starts moving the beams or rebar and the end of the activity may be when the crane stops moving the beams or rebar. Continuing the example, when the crane is moving the beams or rebar, the crane may topple mid-movement five minutes into the activity. Thus, the time point of the unstable condition may be five minutes into the activity. This time point may be used to predict the counterweight to be applied to the at least one machine, described in further detail below with respect to step 212.

Then, at 212, the collaborative equilibrium program 110A, 110B predicts the counterweight to be applied to the at least one machine associated with the unstable condition. The counterweight is predicted based on the time point identified above with respect to step 210. Continuing the example described above with respect to step 210 where the crane topples mid-movement five minutes into the activity, the collaborative equilibrium program 110A, 110B may identify at that time point the speed and direction of any wind gust, the type of ground surface, and whether the surface was sloped or flat. The counterweight may also be predicted based on the dimensions of the one or more objects, the weight of the one or more objects, and/or the materials with which the one or more objects are made. The predicted counterweight may be an additional machine in the multi-machine environment sufficient to handle the combined weight of the at least one machine associated with the unstable condition as well as the objects the at least one machine is handling. For example, the additional machine may be an additional crane in the environment that is currently performing an activity. In another example, the additional machine may be an additional crane in the environment that is not in use. As described above, the ground surface may indicate which additional machine may be used. For example, in a wet and muddy contextual surrounding, an additional crane may be too heavy and sink into the ground. In this contextual surrounding, a lighter additional machine may be predicted that is still able to handle the combined weight of the at least one machine associated with the unstable condition as well as the objects the at least one machine is handling.

Figure 3:
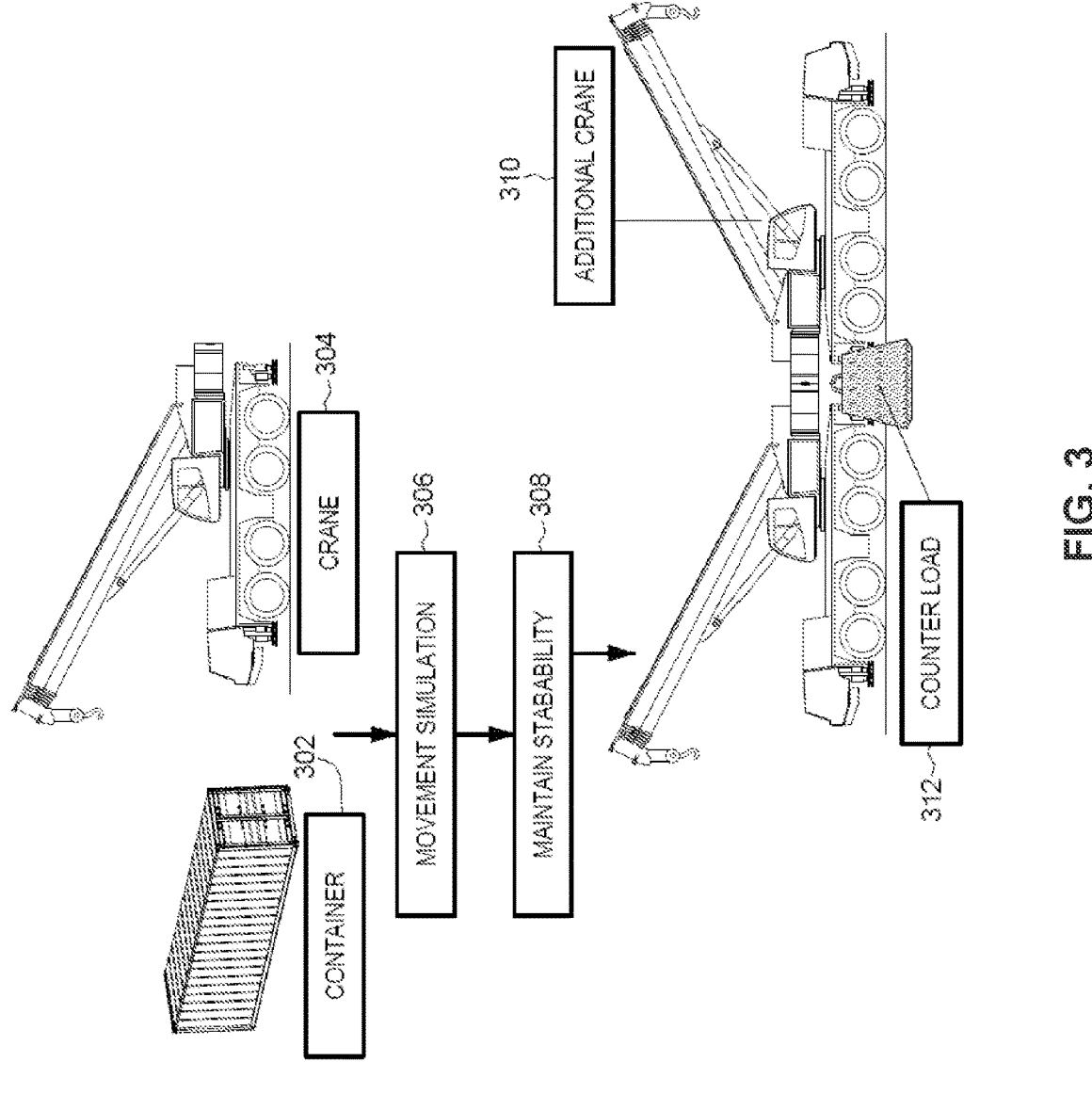
FIG. 3 is an exemplary diagram depicting machinery interacting with an object according to at least one embodiment.

Next, at 214, the collaborative equilibrium program 110A, 110B applies the counterweight in the digital twin simulation to the at least one machine associated with the unstable condition. The application of the counterweight is based on the prediction described above with respect to step 212. The applied counterweight may be the additional machine attached to the at least one machine. According to at least one embodiment, when more than one machine is required to perform the activity, the at least one machine associated with the unstable condition and the additional machine may be attached so that the at least one machine and the additional machine perform the activity in different directions, as illustrated in FIG. 3.

According to at least one other embodiment, while executing the digital twin simulation, the additional machine may move dynamically as a center of gravity of the at least one machine associated with the unstable condition changes. For example, when the wind blows from east to west causing a component of the at least one machine to bend toward the west, the additional machine may move toward the east to achieve equilibrium of forces acting on the at least one machine. In another example, the slope of the ground surface may have an impact on the center of gravity. In this example, the additional machine may move so that the additional machine is perfectly in line with the at least one machine. Similarly, the center of gravity of the at least one machine may change as the machine moves an object from one direction to the other. As the center of gravity changes, the additional machine may move in the appropriate direction to achieve equilibrium.

Then, at 216, the collaborative equilibrium program 110A, 110B validates the application of the counterweight in the digital twin simulation. The application of the counterweight is validated by executing an updated digital twin simulation with the counterweight attached to the at least one machine. The updated digital twin simulation may perform the same range of motions as in the digital twin simulation. According to at least one embodiment, the updated digital twin simulation may be executed from the beginning of the activity. According to at least one embodiment, the updated digital twin simulation may be executed slightly before (e.g., one minute) the time point of the unstable condition.

In either embodiment, in response to determining the unstable condition is detected in the updated digital twin simulation, an additional counterweight may be attached to the at least one machine associated with the unstable condition. For example, the at least one machine may topple even when the additional machine is attached. The additional counterweight may be a static object, such as an object made of iron, steel, concrete, and/or other alloys, as illustrated in FIG. 3. The static object may be attached to the at least one machine along with the additional machine to achieve equilibrium. The application of the counterweight may be validated when no unstable condition is detected at any time point during the updated digital twin simulation.

Referring now to FIG. 3, an exemplary diagram 300 depicting machinery interacting with an object is shown according to at least one embodiment. In the diagram 300, a container 302 may be the object to be moved by the crane 304. The movement simulation 306 (i.e., the digital twin simulation in FIG. 2), may simulate the range of movement of the crane 304 while handling the container 302. During the movement simulation 306, the crane 304 may topple while attempting to move the container 302. In order to maintain stability 308 (i.e., prevent toppling and/or damage to the crane 304), the additional crane 310 may be attached to the crane 304.

According to at least one embodiment, and as described above in FIG. 2, the additional crane 310 may not be sufficient to maintain stability 308. Thus, the additional counterweight 312 (i.e., the static object in FIG. 2), may be attached to the crane 304 along with the additional crane 310.

According to at least one other embodiment, and as described above in FIG. 2, multiple machines in the multi-machine environment may be required to perform the activity. In this embodiment, the crane 304 and the additional crane 310 may be attached in such a manner as to perform the activity from different directions.

According to at least one further embodiment, once the collaborative equilibrium program 110A, 110B maintains stability 308, the data from the movement simulation 306 may be recorded and stored in a database, such as database 116. In this manner, the data may be used to perform the activity in the real-world and achieve equilibrium.

It may be appreciated that FIGS. 2 and 3 provide only an illustration of one implementation and do not imply any limitations with regard to how different embodiments may be implemented. Many modifications to the depicted environments may be made based on design and implementation requirements.

Figure 4:
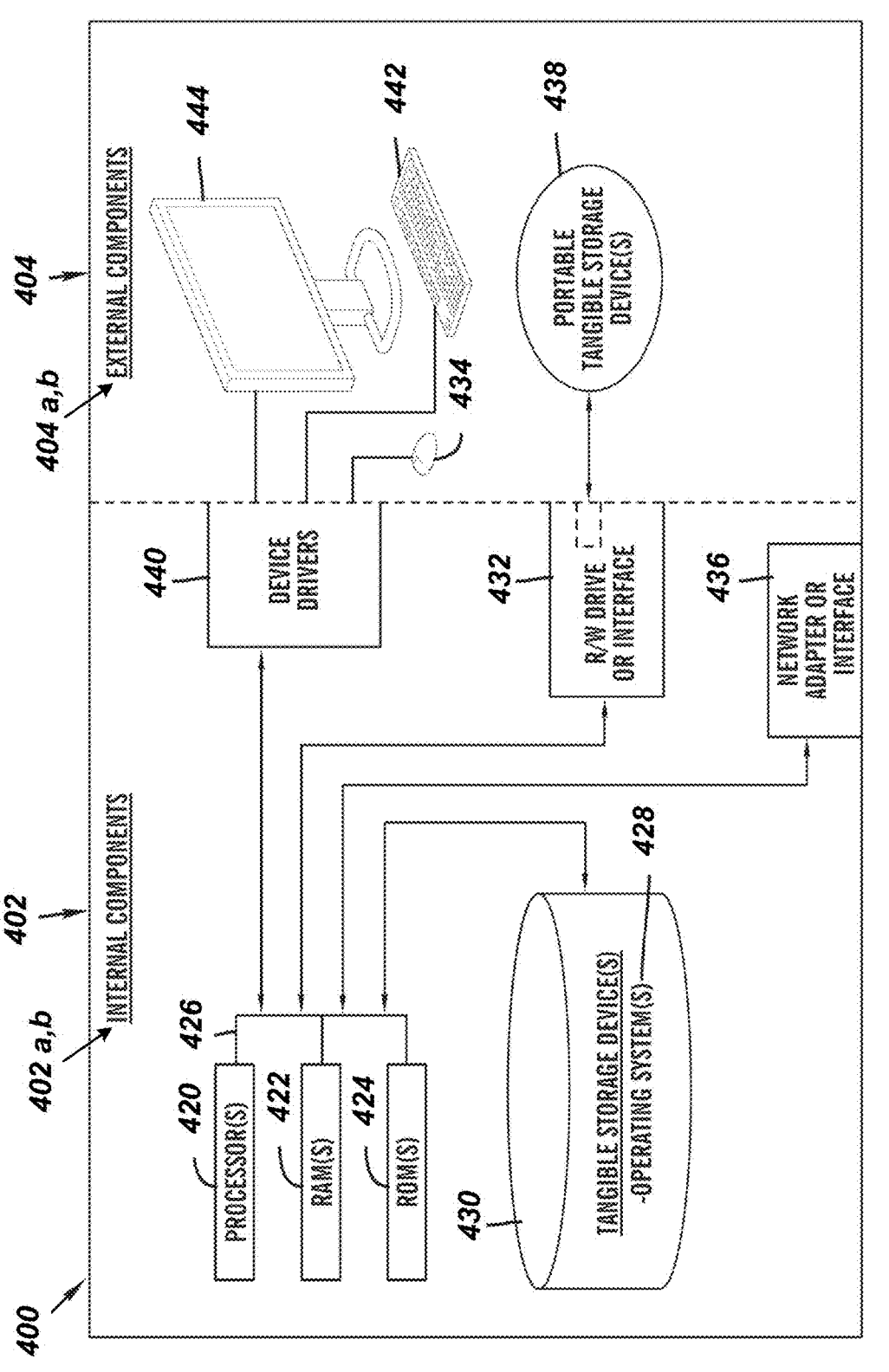
FIG. 4 is a functional block diagram of internal and external components of computers and servers depicted in FIG. 1 according to at least one embodiment.

FIG. 4 is a block diagram 400 of internal and external components of the client computing device 102 and the server 112 depicted in FIG. 1 in accordance with an embodiment of the present invention. It should be appreciated that FIG. 4 provides only an illustration of one implementation and does not imply any limitations with regard to the environments in which different embodiments may be implemented. Many modifications to the depicted environments may be made based on design and implementation requirements.

The data processing system 402, 404 is representative of any electronic device capable of executing machine-readable program instructions. The data processing system 402, 404 may be representative of a smart phone, a computer system, PDA, or other electronic devices. Examples of computing systems, environments, and/or configurations that may be represented by the data processing system 402, 404 include, but are not limited to, personal computer systems, server computer systems, thin clients, thick clients, handheld or laptop devices, multiprocessor systems, microprocessor-based systems, network PCs, minicomputer systems, and distributed cloud computing environments that include any of the above systems or devices.

The client computing device 102 and the server 112 may include respective sets of internal components 402 a,b and external components 404 a,b illustrated in FIG. 4. Each of the sets of internal components 402 include one or more processors 420, one or more computer-readable RAMs 422, and one or more computer-readable ROMs 424 on one or more buses 426, and one or more operating systems 428 and one or more computer-readable tangible storage devices 430. The one or more operating systems 428, the software program 108 and the collaborative equilibrium program 110A in the client computing device 102 and the collaborative equilibrium program 110B in the server 112 are stored on one or more of the respective computer-readable tangible storage devices 430 for execution by one or more of the respective processors 420 via one or more of the respective RAMs 422 (which typically include cache memory). In the embodiment illustrated in FIG. 4, each of the computer-readable tangible storage devices 430 is a magnetic disk storage device of an internal hard drive. Alternatively, each of the computer-readable tangible storage devices 430 is a semiconductor storage device such as ROM 424, EPROM, flash memory or any other computer-readable tangible storage device that can store a computer program and digital information.

Each set of internal components 402 a,b also includes a RAY drive or interface 432 to read from and write to one or more portable computer-readable tangible storage devices 438 such as a CD-ROM, DVD, memory stick, magnetic tape, magnetic disk, optical disk or semiconductor storage device. A software program, such as the collaborative equilibrium program 110A, 110B, can be stored on one or more of the respective portable computer-readable tangible storage devices 438, read via the respective RAY drive or interface 432, and loaded into the respective hard drive 430.

Each set of internal components 402 a,b also includes network adapters or interfaces 436 such as a TCP/IP adapter cards, wireless Wi-Fi interface cards, or 3G or 4G wireless interface cards or other wired or wireless communication links. The software program 108 and the collaborative equilibrium program 110A in the client computing device 102 and the collaborative equilibrium program 110B in the server 112 can be downloaded to the client computing device 102 and the server 112 from an external computer via a network (for example, the Internet, a local area network or other, wide area network) and respective network adapters or interfaces 436. From the network adapters or interfaces 436, the software program 108 and the collaborative equilibrium program 110A in the client computing device 102 and the collaborative equilibrium program 110B in the server 112 are loaded into the respective hard drive 430. The network may comprise copper wires, optical fibers, wireless transmission, routers, firewalls, switches, gateway computers and/or edge servers.

Each of the sets of external components 404 a,b can include a computer display monitor 444, a keyboard 442, and a computer mouse 434. External components 404 a,b can also include touch screens, virtual keyboards, touch pads, pointing devices, and other human interface devices. Each of the sets of internal components 402 a,b also includes device drivers 440 to interface to computer display monitor 444, keyboard 442, and computer mouse 434. The device drivers 440, R/W drive or interface 432, and network adapter or interface 436 comprise hardware and software (stored in storage device 430 and/or ROM 424).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
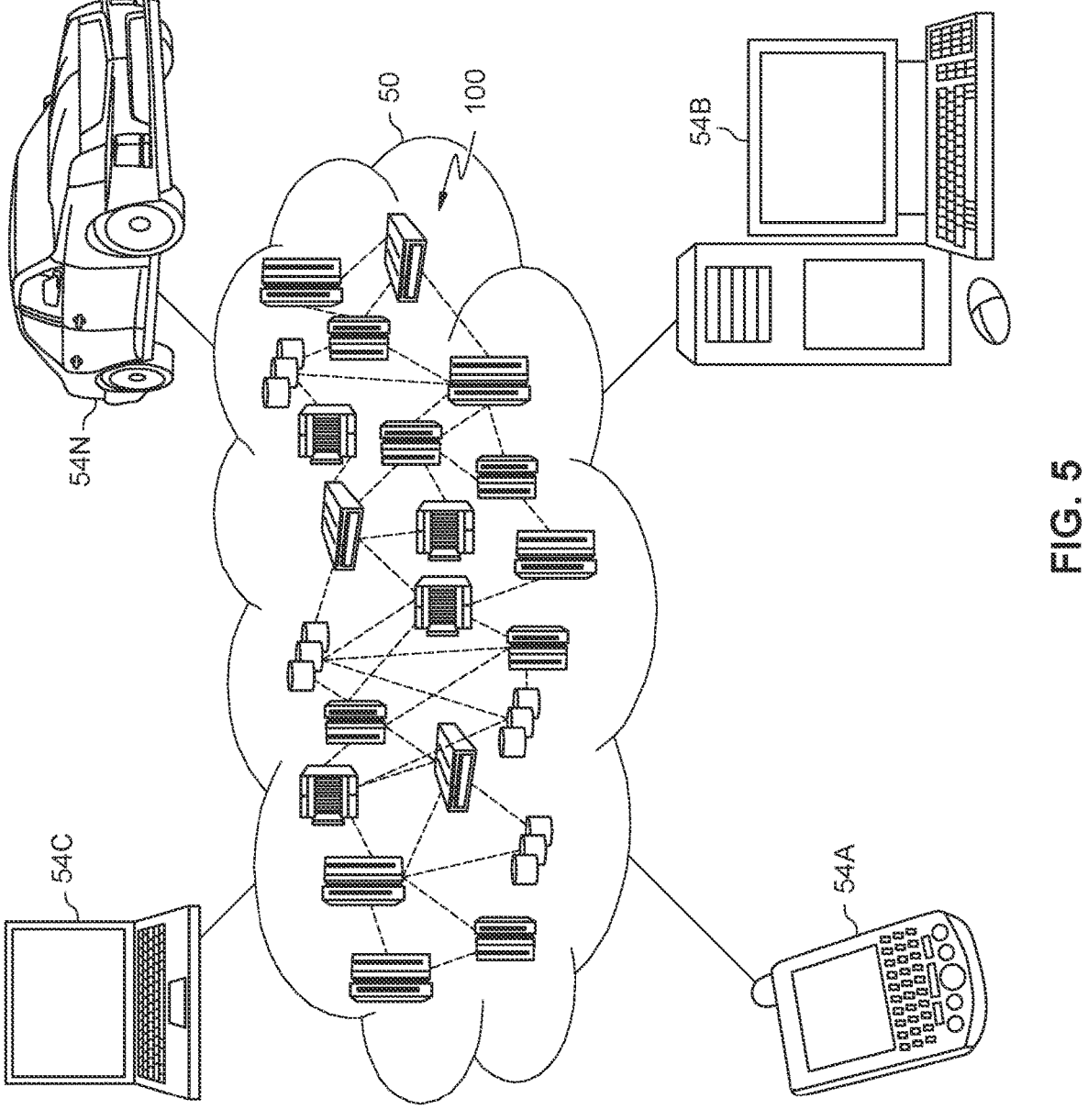
FIG. 5 depicts a cloud computing environment according to an embodiment of the present invention.

Referring now to FIG. 5, illustrative cloud computing environment 50 is depicted. As shown, cloud computing environment 50 comprises one or more cloud computing nodes 100 with which local computing devices used by cloud consumers, such as, for example, personal digital assistant (PDA) or cellular telephone 54A, desktop computer 54B, laptop computer 54C, and/or automobile computer system 54N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 100 and cloud computing environment 50 can communicate with any type of computerized device over any type of network and/or network addressable connection (e.g., using a web browser).

Figure 6:
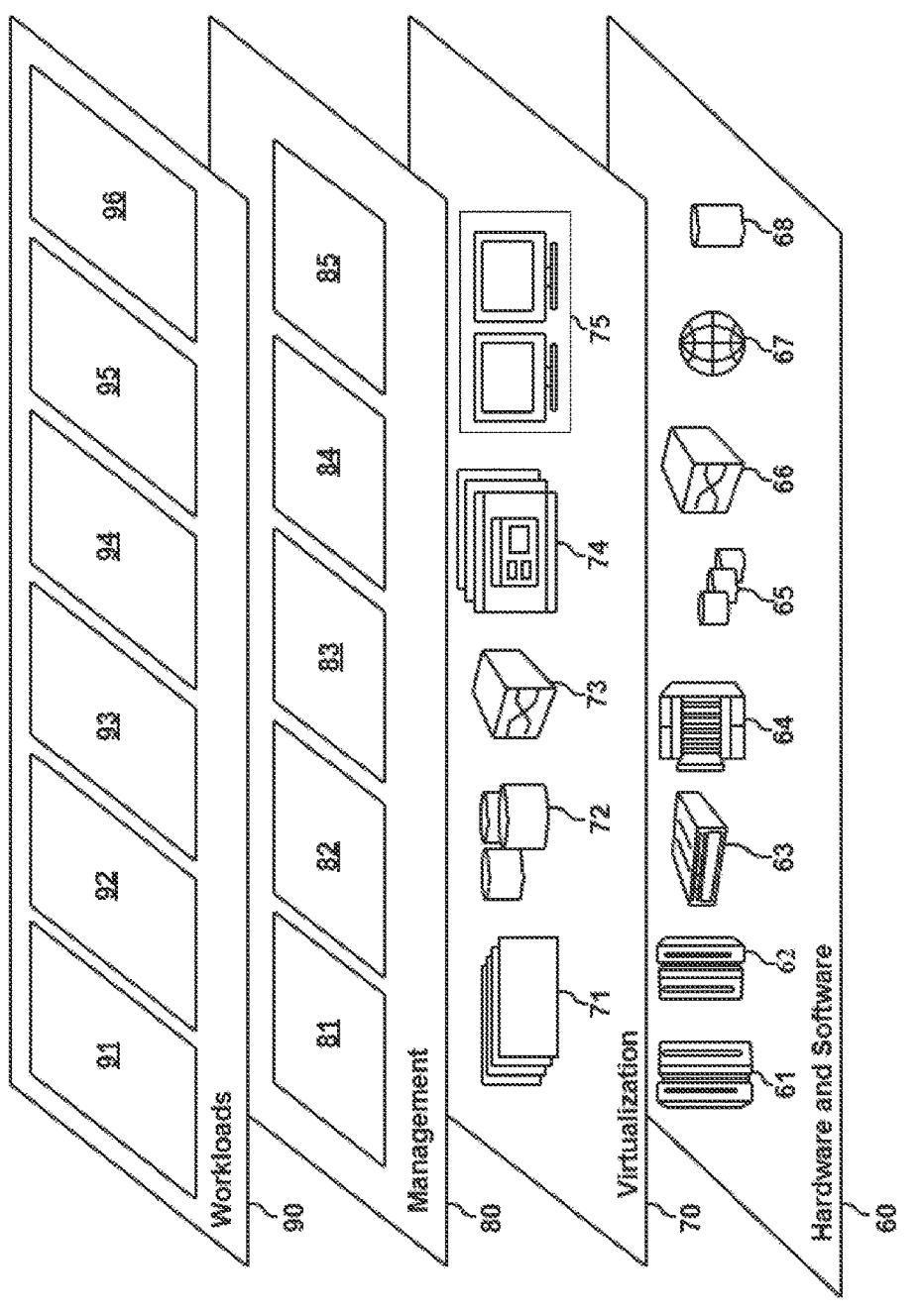
FIG. 6 depicts abstraction model layers according to an embodiment of the present invention.

Referring now to FIG. 6, a set of functional abstraction layers 600 provided by cloud computing environment 50 is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and simulating collaborative equilibrium in a multi-machine environment 96. Simulating collaborative equilibrium in a multi-machine environment 96 may relate to determining whether an unstable condition associated with a machine (e.g., toppling) is detected during a digital twin simulation in order to predict a counterweight to be applied to the machine associated with the unstable condition.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-based method of simulating collaborative equilibrium in a multi-machine environment, the method comprising:
   receiving data relating to an activity and one or more machines to perform the activity;
   identifying specifications of one or more objects associated with the activity and specifications of the one or more machines handling the one or more objects;
   executing a digital twin simulation of the activity based on the specifications of the one or more objects, the specifications of the one or more machines, and a contextual surrounding of the activity;
   determining whether an unstable condition associated with at least one machine of the one or more machines is detected at any time point during the digital twin simulation;
   in response to determining the unstable condition is detected, identifying the time point of the unstable condition;
   predicting a counterweight to be applied to the at least one machine associated with the unstable condition based on the time point; and
   applying the counterweight in the digital twin simulation to the at least one machine associated with the unstable condition based on the prediction.

2. The computer-based method of claim 1, further comprising:
   validating the application of the counterweight in the digital twin simulation by executing an updated digital twin simulation with the counterweight attached to the at least one machine.

3. The computer-based method of claim 1, wherein the counterweight applied to the at least one machine associated with the unstable condition is an additional machine attached to the at least one machine.

4. The computer-based method of claim 2, wherein validating the application of the counterweight in the digital twin simulation further comprises:
   attaching an additional counterweight to the at least one machine associated with the unstable condition in response to determining the unstable condition is detected in the updated digital twin simulation.

5. The computer-based method of claim 3, wherein the additional machine moves dynamically as a center of gravity of the at least one machine associated with the unstable condition changes.

6. The computer-based method of claim 1, wherein the contextual surrounding of the activity includes a surface type where the activity is to be performed and a slope of the surface.

7. The computer-based method of claim 1, wherein the unstable condition is selected from a group consisting of a toppling of the at least one machine and a deformity in the at least one machine.

8. A computer system, the computer system comprising:
   one or more processors, one or more computer-readable memories, one or more computer-readable tangible storage medium, and program instructions stored on at least one of the one or more computer-readable tangible storage medium for execution by at least one of the one or more processors via at least one of the one or more computer-readable memories, wherein the computer system is performing a method comprising:
   receiving data relating to an activity and one or more machines to perform the activity;
   identifying specifications of one or more objects associated with the activity and specifications of the one or more machines handling the one or more objects;
   executing a digital twin simulation of the activity based on the specifications of the one or more objects, the specifications of the one or more machines, and a contextual surrounding of the activity;
   determining whether an unstable condition associated with at least one machine of the one or more machines is detected at any time point during the digital twin simulation;
   in response to determining the unstable condition is detected, identifying the time point of the unstable condition;
   predicting a counterweight to be applied to the at least one machine associated with the unstable condition based on the time point; and
   applying the counterweight in the digital twin simulation to the at least one machine associated with the unstable condition based on the prediction.

9. The computer system of claim 8, further comprising:
   validating the application of the counterweight in the digital twin simulation by executing an updated digital twin simulation with the counterweight attached to the at least one machine.

10. The computer system of claim 8, wherein the counterweight applied to the at least one machine associated with the unstable condition is an additional machine attached to the at least one machine.

11. The computer system of claim 9, wherein validating the application of the counterweight in the digital twin simulation further comprises:
   attaching an additional counterweight to the at least one machine associated with the unstable condition in response to determining the unstable condition is detected in the updated digital twin simulation.

12. The computer system of claim 10, wherein the additional machine moves dynamically as a center of gravity of the at least one machine associated with the unstable condition changes.

13. The computer system of claim 8, wherein the contextual surrounding of the activity includes a surface type where the activity is to be performed and a slope of the surface.

14. The computer system of claim 8, wherein the unstable condition is selected from a group consisting of a toppling of the at least one machine and a deformity in the at least one machine.

15. A computer program product, the computer program product comprising:

one or more computer-readable storage medium and program instructions stored on at least one of the one or more computer-readable storage medium, the program instructions executable by a processor capable of performing a method, the method comprising:

receiving data relating to an activity and one or more machines to perform the activity;

identifying specifications of one or more objects associated with the activity and specifications of the one or more machines handling the one or more objects;

executing a digital twin simulation of the activity based on the specifications of the one or more objects, the specifications of the one or more machines, and a contextual surrounding of the activity;

determining whether an unstable condition associated with at least one machine of the one or more machines is detected at any time point during the digital twin simulation;

in response to determining the unstable condition is detected, identifying the time point of the unstable condition;

predicting a counterweight to be applied to the at least one machine associated with the unstable condition based on the time point; and applying the counterweight in the digital twin simulation to the at least one machine associated with the unstable condition based on the prediction.

16. The computer program product of claim 15, further comprising:

validating the application of the counterweight in the digital twin simulation by executing an updated digital twin simulation with the counterweight attached to the at least one machine.

17. The computer program product of claim 15, wherein the counterweight applied to the at least one machine associated with the unstable condition is an additional machine attached to the at least one machine.

18. The computer program product of claim 16, wherein validating the application of the counterweight in the digital twin simulation further comprises:

attaching an additional counterweight to the at least one machine associated with the unstable condition in response to determining the unstable condition is detected in the updated digital twin simulation.

19. The computer program product of claim 17, wherein the additional machine moves dynamically as a center of gravity of the at least one machine associated with the unstable condition changes.

20. The computer program product of claim 15, wherein the contextual surrounding of the activity includes a surface type where the activity is to be performed and a slope of the surface.

* * * * *